United States Patent [19]

Harayda et al.

[11] 4,004,195
[45] Jan. 18, 1977

[54] HEAT-SINK ASSEMBLY FOR HIGH-POWER STUD-MOUNTED SEMICONDUCTOR DEVICE

[75] Inventors: George Michael Harayda, Middlesex; Wayne Miller Austin, Flemington, both of N.J.

[73] Assignee: RCA Corporation, New York, N.Y.

[22] Filed: May 12, 1975

[21] Appl. No.: 576,607

[52] U.S. Cl. .................................. 317/100; 357/81; 174/52 FP

[51] Int. Cl.² ........................................ H01L 23/40

[58] Field of Search ............... 248/221 R, 300, 65, 248/67.7, 74 R, 74 A; 317/100, 101 CC; 357/81; 174/52 FP, 16 HS

[56] References Cited

UNITED STATES PATENTS

| | | | |
|---|---|---|---|
| 2,701,866 | 2/1955 | Chapman | 174/16 HS |
| 2,826,385 | 3/1958 | Osborn | 248/300 |
| 3,211,822 | 10/1965 | Krall | 174/16 HS |
| 3,237,905 | 3/1966 | Baker | 248/300 |
| 3,257,621 | 6/1966 | Jadoul | 357/81 |
| 3,259,813 | 7/1966 | Linstrand | 174/16 HS |
| 3,271,722 | 9/1966 | Garstang | 174/16 HS |
| 3,522,491 | 8/1970 | Coe | 174/16 HS |
| 3,665,256 | 5/1972 | Goun | 174/15 R |
| 3,711,752 | 1/1973 | Nier | 357/81 |
| 3,836,825 | 9/1974 | Hall | 317/100 |

Primary Examiner—Gerald P. Tolin
Attorney, Agent, or Firm—H. Christoffersen; R. P. Williams; T. H. Magee

[57] ABSTRACT

A heat-sink assembly adapted for use with a high-power stud-mounted semiconductor device comprises a heat-dispersing arm having one end securely attached to a circuit board and the other end shaped for semi-permanent connection and thermal coupling to a heat-conductive stud. The arm is sufficiently bendable to allow displacement thereof from above the surface of the device mounted on the circuit board for removal of the device from the circuit board after disconnecting the other end from the stud while keeping the one end securely attached to the circuit board. The heat-sink assembly may further comprise means for semipermanently connecting the other end of the arm to the stud and retaining the other end in intimate thermal contact therewith.

11 Claims, 6 Drawing Figures

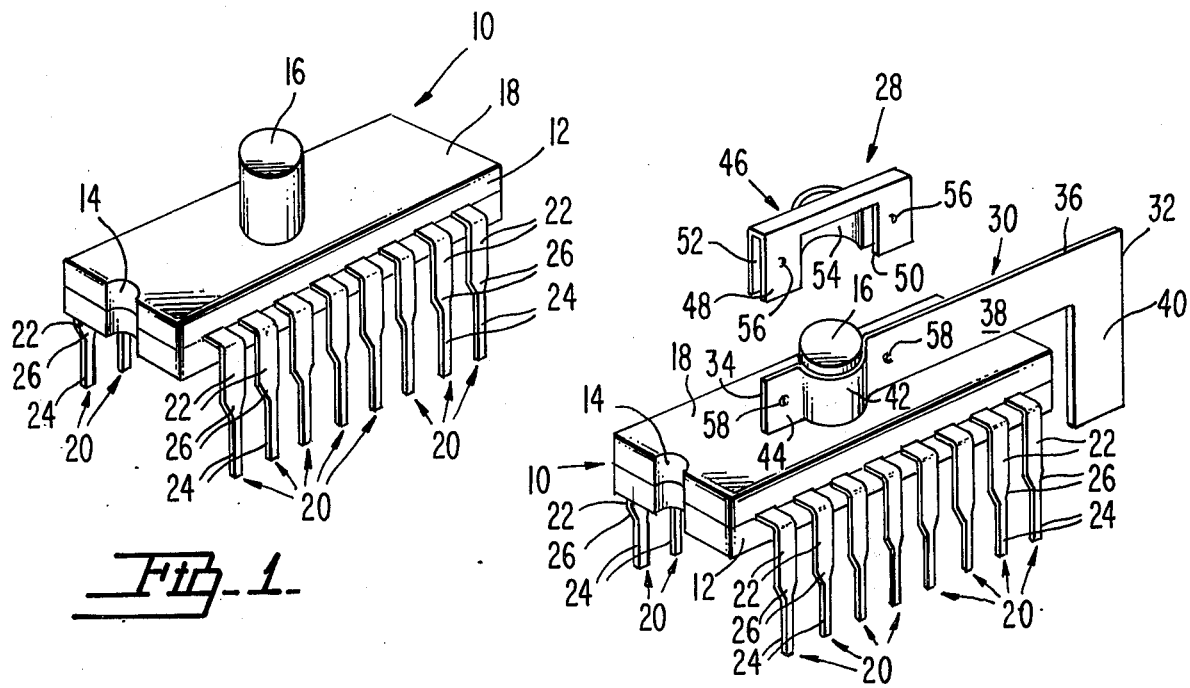
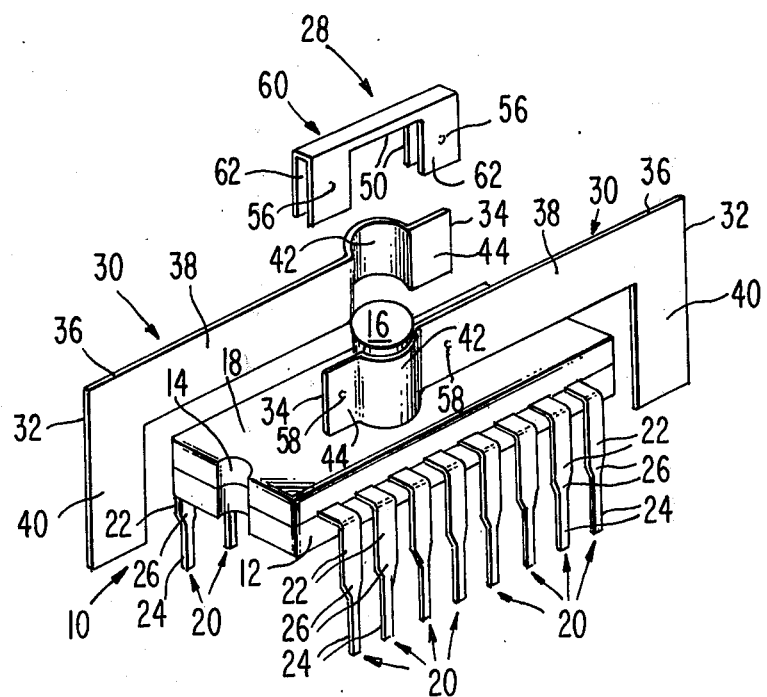

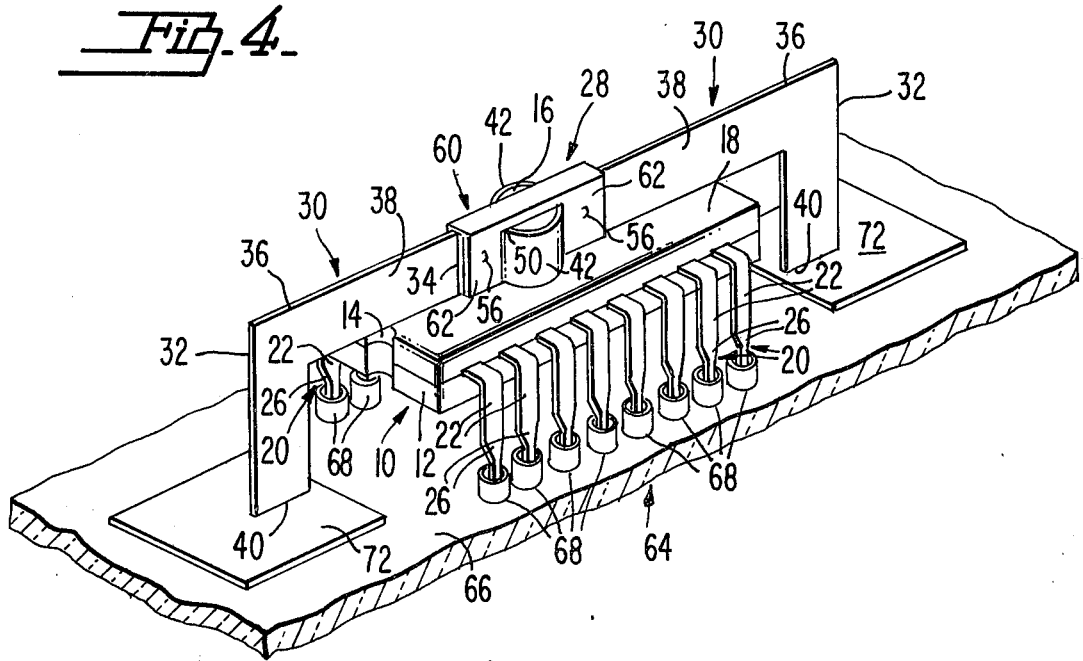
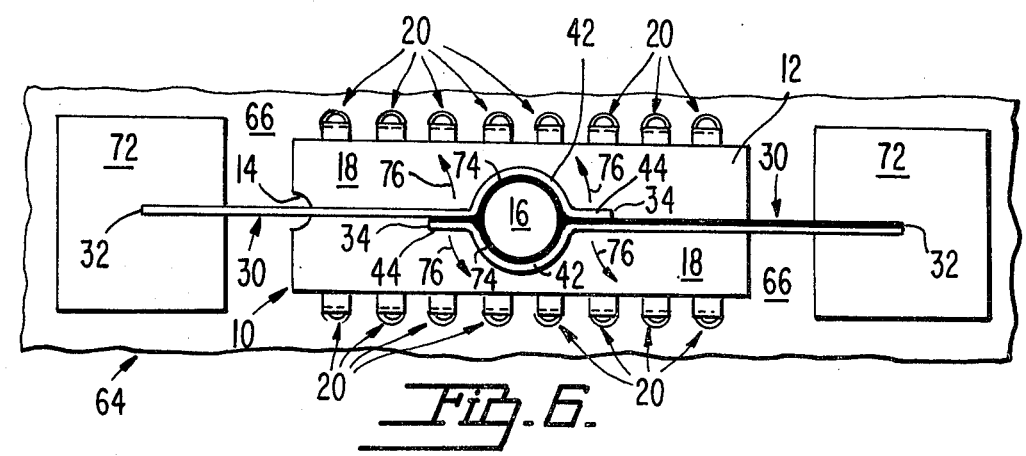

HEAT-SINK ASSEMBLY FOR HIGH-POWER STUD-MOUNTED SEMICONDUCTOR DEVICE

This invention relates to a heat-sink assembly adapted for use with a semiconductor device adapted to be mounted on a circuit board and having a heat-conductive stud emerging from a surface of the device away from the circuit board.

Semiconductor devices are limited in their power handling capacity primarily by their ability to dissipate heat generated during operation. Thus, with the exception of devices designed for extremely low-power functions, some arrangement is usually provided to dissipate the heat generated by the devices in the environment in which they are to operate.

For efficient dissipation of the heat generated during the operation of a semiconductor device, it is desirable to provide such a device in a package that can easily be attached to a suitable heat sink for removing heat from within the package. One convenient known package is described in U.S. Pat. No. 3,836,825, issued to Hall and Koskulitz on Sept. 17, 1974, and assigned to the same assignee as is the present application. In this package, an integrated circuit chip having circuit elements capable of relatively high-power operation is encapsulated in a body of polymeric material having the form of an elongated prism. Conductors are electrically coupled to the circuit elements on the chip and extend outwardly of the body through a relatively long side thereof. A heat-conductive stud is anchored in the body and is thermally coupled to the chip. The stud extends outwardly of the package through another of its relatively long sides. Heat is removed from this high-power stud-mounted semiconductor device by air convection, which may be rather restricted, and by radiation from the relatively small surface of the exposed stud.

In order to further enhance heat dissipation from such a "power-stud" package, a heat sink may be thermally coupled to the stud outside of the package. A typical heat sink may comprise a relatively large heat-conductive structure having radiating fins to increase its heat-transfer area and thereby enhance its convective cooling capability, or may comprise a heat conductor thermally coupled to an external heat-dispersing means such as, for example, a relatively broad-area foil disposed on and supported by a circuit board upon which the semiconductor device is mounted. However, in heat sinks of the latter type, the heat conductor is usually connected to the semiconductor device in a quasi permanent manner which precludes removal of the heat conductor readily therefrom in order to provide for easy serviceability of the device. A convenient and inexpensive approach to efficiently heat sink the "power-stud" package and also afford ease of serviceability is highly desirable.

IN THE DRAWING

FIG. 1 is a perspective view showing a typical 16-lead dual-in-line plastic packaged semiconductor device having a heat-conductive stud emerging from a surface thereof.

FIG. 2 is an exploded perspective view showing one embodiment of the present novel heat-sink assembly along with a typical stud-mounted semiconductor device.

FIG. 3 is an exploded perspective view showing a second embodiment of the present novel heat-sink assembly along with a typical stud-mounted semiconductor device.

FIG. 4 is a perspective view showing the heat-sink assembly shown in FIG. 3 connected and thermally coupled to the semiconductor device, using a retaining spring clip, and to a circuit board upon which the device is mounted.

FIG. 5 is a side view showing the semiconductor device, circuit board, and heat-sink assembly shown in FIG. 4, without the spring clip attached.

FIG. 6 is a plan view of the semiconductor device, circuit board, and heat-sink assembly shown in FIG. 5.

Referring to FIG. 1 of the drawings, there is shown a typical plastic-packaged semiconductor device 10 adapted to be mounted on a circuit board. The device 10 includes an elongated and rectangular prismatic body 12 of polymeric material such as for example, a moldable epoxy plastic. One of the ends of the body 12 is identified by having a notch 14 therein. The device 10 also includes a heat-conductive stud 16 such as, for example, a nickel-plated copper stud which emerges from a surface 18 of the body 12 away from the circuit board on which the device 10 is adapted to be mounted. Typically, the stud 16 has the form of a right circular cylinder of relatively large diameter compared to the dimensions of the body 12, as shown in the drawings. A plurality of coplanar electrical leads 20 emerge from the body 12, forming a 16-lead dual-in-line package in this example. Each of the leads 20 has a relatively broad portion 22, a relatively narrow portion 24, and a tapered shoulder 26 between each of these portions, as is conventional. In assembling the device 10 on a printed-circuit board, the narrower portions 24 of the leads 20 are introduced through openings in the printed-circuit board and the tapered shoulders 26 engage the surface of the board to define the degree of insertion of the leads 20 and the height of standoff of the body 12 from the surface of the board.

The details of construction within the body 12 of the semiconductor device 10 are not necessary to an understanding of the present invention and are not shown in FIG. 1. However, it is to be understood that the device 10 has a semiconductor integrated circuit chip and a portion of the heat-conductive stud 16 mounted and thermally coupled to a chip-supporting pad on opposite sides thereof within the body 12. Such a chip contains active elements such as, for example, transistors, adapted to operate at relatively high power levels and electrically connected by wires to the leads 20 which, along with the chip supporting pad, may have been part of a conventional lead frame. Structures of this kind are described in greater detail, for example, in Hall et al., mentioned above.

Referring to FIG. 2, there is shown one embodiment of a heat-sink assembly 28 adapted for use with the stud-mounted semiconductor device 10. The heat-sink assembly 28 comprises a heat-dispersing arm 30 of heat-conductive material having one end 32 thereof adapted for secure attachment to a circuit board (not shown in FIG. 1). The other end 34 of the arm 30 is shaped for semipermanent connection and thermal coupling to the heat-conductive stud 16 of the device 10. The arm 30 should be sufficiently bendable, while keeping the one end 32 of the arm 30 securely attached to a circuit board, to allow displacement thereof from above the surface 18 of the device 10 for removal of the device 10 from the circuit board after disconnecting the other end 34 from the stud 16.

The arm 30 may have any configuration and be made of any heat-conductive material capable of meeting the aforementioned limitations. In the embodiment shown in FIG. 1, the arm 30 comprises a rectangular-shaped strap 36 which may be stamped from a flat sheet of heat-conductive metal such as, for example, copper, aluminum, or brass. Preferably, the arm 30 has a relatively broad-area elongate-shaped middle 38 in order to increase its heat-transfer area and thereby enhance its convective cooling capability. As shown in FIG. 2, the one end 32 of the arm 30 is adapted for attachment to a circuit board by having an upsidedown L shape whereby the downward-sloping section 40 of the L may be inserted through a hole in the circuit board and attached thereto by means such as, for example, solder or a retaining clip.

The other end 34 of the arm 30 may have any configuration capable of being thermally coupled to the heat-conductive stud 16 in a semipermanent manner, which permits the other end 34 to be easily disconnected from the stud 16 while keeping the one end 32 attached to a circuit board. In the embodiment shown in FIG. 2, the other end 34 comprises a partial semicircular cylindrical portion 42, formed near an end section 44 of the rectangular-shaped strap 36 and having a radius of curvature substantially the same as the radius of curvature of the cylindrically shaped stud 16. Thus, the contour of the other end 34 conforms closely to the contour of the stud 16, providing for highly efficient thermal coupling therebetween.

The heat-sink assembly 28 may also include means for semipermanently connecting the other end 34 of the arm 30 to the heat-conductive stud 16 and retaining the other end 34 in intimate thermal contact therewith. The connecting means may not be necessary, for example, if the arm 30 of the heat-sink assembly 28 has sufficient resiliency to connect and retain the other end 34 thereof in intimate thermal contact with the stud 16. Such means may include a resilient spring clip which is shaped to engage and retain the other end 34 in intimate contact with the stud 16. Preferably, the means comprises a resilient U-shaped spring clip 46, as shown in FIG. 2, which is contoured to be attached over the stud 16 in contact with the other end 34 and to engage and retain the semicircular cylindrical portion 42 in contact with the stud 16. One side 48 of the clip 46 has a U-shaped arm 50 therein which allows the semicircular cylindrical portion 42 to project therethrough when the clip 46 is attached over the stud 16. The other side 52 of the clip 46 has a cylindrically shaped rib 54, formed therein and having a radius of curvature substantially the same as the radius of curvature of the cylindrically shaped stud 16. Thus, the contour of the rib 54 conforms closely to the contour of the stud 16, enabling the clip 46 to engage and retain the stud 16 in intimate contact with the semicircular cylindrical portion 42.

The spring clip 46 may also have included therein a plurality of pressed-in dimples 56, as shown in FIG. 2, which are positioned to mate with small indentations 58 disposed in the arm 30 when the clip 46 is attached thereto. After attaching the resilient clip 46 over the stud 16 in contact with the other end 34 of the arm 30, the pressed-in dimples 56 engage with the small indentations 58, thereby positioning and retaining the clip 46 in precise location with respect to the arm 30. Such a retaining clip 46 is removable and reusable, and may be manufactured by being stamped from a sheet of heat-conductive metal such as, for example, copper, aluminum, brass, or spring steel.

Referring to FIG. 3, there is shown a second embodiment of the heat-sink assembly 28 which further comprises a pair of the heat-dispersing arms 30 positioned so that the middles 38 thereof extend from the heat-conductive stud 16 in opposite directions when connected thereto. By having two arms 30 extend from the stud 16 in different directions, the cooling capability of the heat-sink assembly 28 is further enhanced. Also, by positioning the elongate-shaped middles 38 in this manner, the other ends 34 of the arms 30 are able to be connected to the stud 16 in a complementary manner in that the semicircular cylindrical portions 42 complement each other to completely surround the heat-conductive stud 16. Production of such a heat-sink assembly 28 is economical since both arms 30 thereof are identical and may be provided by manufacturing a single stamped part. When the arms 30 are connected to the stud 16, each end section 44 thereof is flush with a portion of the middle 38 of the arm 30 positioned opposite thereto. Consequently, in this second embodiment, the connecting means may comprise a symmetrical U-shaped spring clip 60, as shown in FIG. 3. This spring clip 60 is similar to the spring clip 46 shown in the first embodiment but has the U-shaped arch 50 disposed in both sides 62 thereof to allow the semicircular cylindrical portion 42 to project therethrough. Such spring clips may have any configuration such as, for example, one having additional heat-conductive tabs (not shown) extending therefrom in order to provide additional heat-transfer area which further enhances the convective and radiative cooling capability of the heat-sink assembly 28.

Referring to FIGS. 4, 5 and 6, there is shown the second embodiment of the heat-sink assembly 28 connected and thermally coupled to both the power-stud semiconductor device 10 using the symmetrical spring clip 60 and a printed-circuit board 64 upon which the device 10 is mounted. The printed-circuit board 64 includes a nonconductive substrate 66 having a plurality of openings provided therein which accommodate the electrical leads 20 in conventional manner, as shown in FIG. 4. In the present example, the openings comprise socket-pins 68 which are soldered into the non-conductive substrate 66 and are electrically connected to a plurality of electrical conductors 70 disposed on the opposite side of the nonconductive substrate 66, as shown in FIG. 5.

The arms 30 of the heat-sink assembly 28 are securely attached to the nonconductive substrate 66 of the printed-circuit board 64, as shown in FIG. 5. In the present embodiment, the downward-sloping sections 40 of the L-shaped ends 32 are inserted through holes in the substrate 66 and attached thereto by means such as, for example, solder.

The heat-sink assembly 28 may further include an external heat-dispersing means supported by the nonconductive substrate 66 of the printed-circuit board 64 and thermally coupled to the downward-sloping sections 40 of the L-shaped ends 32. Preferably, such heat-dispersing means comprises a pair of relatively broad-area foils 72 such as, for example, copper foils which are disposed on the substrate 66 and thermally coupled respectively to the sections 40 of the L-shaped ends 32, as shown in FIGS. 4 and 5. The foils 72 constitute an additional heat-sink and radiator which further enhance the cooling capability of the heat-sink assembly 28.

In the assembled heat-sink assembly 28, the ends 34 of the arms 30 are connected and thermally coupled to the heat-conductive stud 16 in a complementary manner as described above. Preferably, the spring clip 60 is attached over the stud 16 in contact with the other ends 34 to retain the semicircular cylindrical portions 42 in contact with the stud 16, as shown in FIG. 4. In order to ensure good thermal coupling between the cylindrical portions 42 and the stud 16, a thermal compound may be applied at the interface 74 adjacent thereto, as shown in FIG. 6. Preferably, the thermal compound is a greasy petrolatum-type material having a low thermal resistance such as, for example, the thermal joint compound available commercially as Thermacote from the Thermalloy Company, Dallas, Texas.

The present novel heat-sink assembly 28 provides not only a convenient and inexpensive approach to efficiently heat sink the power-stud semiconductor device 10, but also a structure which provides both for mechanically holding the device 10 in the socket-pins 68 and for easy serviceability of the device 10. As illustrated in FIG. 4, the arms 30 of the assembled heat-sink assembly 28 are disposed above the surface 18 of the device 10 and thereby form a rigid structure which prevents movement of the device 10 from the socket-pins 68, especially when the spring clip 60 is attached thereto. In order to remove the device 10 from the socket-pins 68, the retaining clip 60 is first removed, and then the arms 30 are bent to the side to allow displacement thereof from above the surface 18 of the device, as shown by direction arrows 76 in FIG. 6. Another advantage of the present invention is that the arms 30 remain securely attached to the printed-circuit board 64 while the device 10 is removed, thereby ensuring their ready availability for reuse upon replacement of a device 10 in the socket-pins 68. The heat-sink assembly 28 is reassembled by following the above steps in reverse order. Consequently, the novel heat-sink assembly 28 is highly desirable in applications where ease of serviceability is a major consideration.

What is claimed is:

1. A heat-sink assembly adapted for use with a semiconductor device adapted to be mounted on a circuit board and having a heat-conductive stud emerging from a surface of said device away from said circuit board comprising
   a heat-dispersing arm of heat-conductive material, said arm having one end thereof adapted for secure attachment to said circuit board, the other end thereof being shaped for semipermanent connection and thermal coupling to said stud, said arm being sufficiently bendable to allow displacement thereof from above said surface of said device for removal of said device from said circuit board after disconnecting said other end from said stud while keeping said one end securely attached to said circuit board.

2. A heat-sink assembly as defined in claim 1 further comprising means for semipermanently connecting said other end of said arm to said stud and retaining said other end in intimate thermal contact therewith.

3. A heat-sink assembly as defined in claim 2 wherein said connecting means comprises a resilient spring clip shaped to engage and retain said other end of said arm in intimate contact with said stud.

4. A heat-sink assembly as defined in claim 2 further comprising a pair of said arms, each of said arms having a relatively broad-area elongate-shaped middle, and wherein said other ends of said arms are adapted for simultaneous connection to said stud in a complementary manner allowing said middles of said arms to extend from said stud in different directions.

5. A heat-sink assembly as defined in claim 4, wherein each of said arms comprises a rectangular-shaped strap having a partial semicircular cylindrical portion formed therein near an end section thereof, and wherein said other ends of said arms comprise said semicircular cylindrical portions.

6. A heat-sink assembly as defined in claim 5 wherein said connecting means comprises a resilient U-shaped spring clip positioned adjacent to said other ends of said arms.

7. A heat-sink assembly as defined in claim 6 wherein said spring clip has included therein a plurality of dimples positioned adjacent to indentations disposed in said arms.

8. A heat-sink assembly as defined in claim 1 further comprising a circuit board including a nonconductive substrate having a plurality of electrical conductors disposed thereon, and wherein said one end of said arm is securely attached to said nonconductive substrate.

9. A heat-sink assembly as defined in claim 8 further comprising an external heat-dispersing means supported by said nonconductive substrate of said circuit board and thermally coupled to said one end of said arm.

10. A heat-sink assembly as defined in claim 9 wherein said heat-dispersing means comprises a relatively broad-area foil disposed on said nonconductive substrate of said circuit board.

11. A heat-sink assembly as defined in claim 8 in combination with a semiconductor device mounted on said circuit board and having a heat-conductive stud emerging from a surface of said device away from said circuit board, said heat-sink assembly being connected and thermally coupled to said stud.

* * * * *